United States Patent [19]
Shimizu et al.

[11] Patent Number: 6,110,328
[45] Date of Patent: Aug. 29, 2000

[54] METHOD OF AN APPARATUS FOR SPUTTERING

[75] Inventors: Junichi Shimizu; Shujiro Watanabe; Satoru Takaki; Hisashi Osaki; Takuji Oyama, all of Yokohama; Eiichi Ando, Ibaraki-ken, all of Japan

[73] Assignee: Asahi Glass Company Ltd., Tokyo, Japan

[21] Appl. No.: 08/759,431

[22] Filed: Dec. 5, 1996

Related U.S. Application Data

[62] Division of application No. 08/281,574, Jul. 28, 1994, Pat. No. 5,660,700.

[30] Foreign Application Priority Data

Jul. 28, 1993 [JP] Japan ................................. 5-205704

[51] Int. Cl.[7] ................................................ C23C 14/34
[52] U.S. Cl. ........................ 204/192.12; 204/192.15; 204/192.18; 204/192.22; 204/192.23; 204/192.26; 204/192.29; 204/298.06; 204/298.08
[58] Field of Search ........................ 204/192.12, 192.15, 204/192.18, 192.23, 192.25, 192.26, 192.29, 298.06, 298.26, 192.22

[56] References Cited

U.S. PATENT DOCUMENTS

| | | | |
|---|---|---|---|
| 4,978,437 | 12/1990 | Wirz | 204/192.26 |
| 5,015,493 | 5/1991 | Gruen | 204/298.05 |
| 5,180,476 | 1/1993 | Ishibashi et al. | 204/192.29 |
| 5,240,581 | 8/1993 | Kim | 204/192.26 |
| 5,241,152 | 8/1993 | Anderson et al. | 204/298.08 |
| 5,286,360 | 2/1994 | Szczyrbowski et al. | 204/298.08 |
| 5,300,205 | 4/1994 | Fritsche | 204/298.08 |
| 5,303,139 | 4/1994 | Mark | 204/298.08 |
| 5,718,813 | 2/1998 | Drummond et al. | 204/192.12 |

FOREIGN PATENT DOCUMENTS

| | | | |
|---|---|---|---|
| 5-148644 | 6/1993 | Japan | 204/298.08 |

OTHER PUBLICATIONS

Anderson et al., "A New Technique for Arc Control in DC Sputtering," Society of Vacuum Coaters, 35th Annual Technical Conference Proceedings, pp. 325–329, 1992.

*Primary Examiner*—Rodney McDonald
*Attorney, Agent, or Firm*—Oblon, Spivak, McClelland, Maier & Neustadt, P.C.

[57] ABSTRACT

A sputtering method comprises applying a negative voltage intermittently in a constant periodic cycle to a cathode disposed in a vacuum chamber, wherein the negative voltage is intermittently applied so that a time during which the negative voltage is not applied includes a time during which the voltage is controlled to be zero volt in a range of from 10 μs to 10 ms, and the zero voltage time is equal to or longer than the time required by one arcing from its generation to extinction.

24 Claims, 5 Drawing Sheets

METHOD OF AN APPARATUS FOR SPUTTERING

This is a Division of application Ser. No. 08/281,574 filed on Jul. 28, 1994 now U.S. Pat. No. 5,660,700.

BACKGROUND OF THE INVENTION

1. Field of the Invention

The present invention relates to a sputtering method in which a pulse-like DC voltage is applied, a film-deposition method by sputtering, an apparatus for obtaining sputtering and a power processing portion for sputtering.

2. Discussion of Background

A cathode for DC sputtering (hereinbelow, referred to as sputtering) can not be used for forming a film of high quality at a high deposition rate unless a problem of abnormal discharge is overcome.

Various causes are considered concerning the abnormal discharge occurring around the cathode (hereinbelow, referred to as arcing). As one of the causes, electric charges are accumulated on a small insulating substance, which is deposited or grown on the surface of a target material, and the electric charges cause arcing to a potentially opposite site, e.g. a substrate on which a film is to be formed, an anode electrode, the inner wall of a vacuum chamber or the surface of the target.

The arcing occurs frequently in a case that an insulating film is produced from a conductive target material by reactive sputtering. When the arcing is generated, arcing energy concentrates locally to a portion of the target surface in a reactive gas atmosphere, this forming an insulation or insulations, whereby the arcing happens frequently in a series. Accordingly, a stable glow discharge effective to sputtering can not be maintained; a sputtering rate becomes unstable and the production of films of uniform quality is impossible. Occasionally, a substrate on which a film is formed is damaged by arcing, or a mechanical component constituting a cathode or a target material or a cathode is molten by arcing.

In order to avoid the above-mentioned disadvantage, a method of using electric power of a high frequency such as 13.56 MHz has been used.

Recently, a technique of preventing arcing by using a waveform proposed in Japanese Unexamined Patent Publication Nos. 148644/1993 and 331634/1993 or using a device to obtain such waveform (the device is commercialized as SPARC-LE by Advanced Energy in U.S.A. Namely, the waveform having a frequency of several kHz which is comparable to the effect obtained by a discharge in 13.56 MHz by applying a pulse-like positive electric potential of about 5 $\mu$s–10 $\mu$s is applied in a periodic cycle to a cathode so that positive electric charges accumulated on a small insulating substance, which is deposited or grown on the surface of a target material are neutralized by attracting electrons in plasma.

Recently, another technique of neutralization of a potential difference on the target surface has been developed as seen in U.S. Pat. No. 5,082,546. Namely, an alternating current having an intermediate frequency such as several tens kHz is applied to a pair of closely disposed cathodes to ignite glow discharges between the two cathodes alternately. In this case, when the electric potential of the cathodes is negative, sputtering is conducted, and when the electric potential is positive, positive electric charges accumulated on a small insulating substance, which is deposited or grown on the surface of a target material are neutralized by attracting electrons in plasma.

The sputtering method using a radio frequency power source having 13.56 MHz is believed to suppress arcing because an insulation can be sputtered. However, it is difficult to form a sputtering apparatus using a radio frequency power source of 13.56 MHz because a power source having an output of 10 kW or more is large and expensive, and an impedance-matching circuit of high voltage and large current is needed.

A sputtering method wherein DC power is used to apply a positive potential intermittently and the power is intermittently off is a useful technique because a potential difference on the target surface can be neutralized and the generation of arcing at the initial stage can be suppressed. Thus, the generation of arcing could be effectively suppressed in comparison with the ordinary DC sputtering method. However, this method has no ability of sputtering an insulating substance unlike the sputtering method using 13.56 MHz, and accordingly, arcing occurs when a continuous discharge is conducted for a long time. When the arcing is generated, discharge energy concentrates locally on the target surface in a reactive gas atmosphere, which further forms an insulation or insulations and results in arcing frequently in a series.

Namely, the neutralization of potential difference on the target surface by applying a positive voltage or 0 voltage intermittently is effective only to a small insulating substance accumulated with a small amount of electric charges if the application time of positive voltage or 0 voltage is short. Accordingly, it is impossible to obtain complete neutralization of an insulating substance accumulated with a large amount of electric charges by sputtering for a long time or of an insulating substance having a large amount of electric charges produced by arcing, with use of a simple intermittent DC power.

In the sputtering method of applying an alternating current to the two closely disposed cathodes, an alternating current of several tens kHz is used. Accordingly, it can be said that this method uses the same principle as the sputtering method with use of the before-mentioned intermittent DC power, i.e. a potential difference on the target surface is neutralized. Further, in this method, the same electrode is used as a cathode and an anode. Accordingly, there is an advantage that when the electrode is used as a cathode, the surface of it is sputtered and cleaned, and when it is used as an anode, the surface is always cleaned whereby a continuous discharge can be stably carried out for a long time. However, this method requires the two closely disposed cathodes and an AC power source of several tens kHz. Accordingly, it is impossible to suppress arcing and stabilize a normal discharge in a simple manner with use of a currently used DC sputtering apparatus.

As another cause of the occurrence of arcing, when a target material is eroded by sputtering, minute protrusions appear in the surface of the target material depending on the kind of material. An electric field concentrates to the protrusions whereby arcing occurs at a local portion. Accordingly, the composition of the target material is changed whereby a portion having a different sputtering yield may appear and uniform sputtering of target surface can not be obtained.

In particular, when an ITO (indium-tin-oxide) film is to be produced by the sputtering method, and when an ITO target or an IT (indium-tin) target is used, indium oxide which is believed to be sub oxide, or a large number of minute black protrusions (hereinbelow, referred to as nodules), are produced on the target surface during continuous sputtering, and the deposition rate of the ITO film is gradually decreased. Further, the arcing frequently occurs, whereby small pieces of the target material scattering by the arcing deposit on the substrate to reduce the quality of the ITO film.

As a common technique to remove the protrusions formed by the erosion of the target is to physically remove them by causing a discharge in an inert gas atmosphere such as Ar gas, i.e. sputter-etching.

Further, when the ITO target is used, a method of removing the nodules by a discharge in a $N_2$ gas atmosphere is proposed in Japanese Unexamined Patent Publication No. 293767/1992.

However, the above-mentioned methods are only effective under the condition that a vacuum chamber is maintained vacuum after the nodules have been formed, and they can not suppress the occurrence of arcing and can not realize a method of a long time stably discharge.

As another technique, there is a method of improving the surface condition of the target formed by the erosion of the target, by increasing the density of a target material of ITO in sintering. However, this method pushes up the cost of the target material and effect can not be expected.

As another technique, there is a method of increasing the density of power at the sputtering to change the erosion of the target. When the density of power is simply increased, the frequency of occurrence of arcing increases and a discharge energy of arcing also increases. So, this method increases adverse effects of the arcing.

It is an object of the present invention to provide a sputtering method, a film-deposition method by sputtering, an apparatus for obtaining sputtering and a power processing portion for sputtering whereby arcing is effectively controlled and a larger power can be supplied quickly to deposit a film of high quality with high deposition rate for a long time.

In accordance with the present invention, there is provided a sputtering method, a film-forming method by sputtering and an apparatus for sputtering and a power processing part for sputtering wherein the negative voltage is intermittently applied so that a time during which the negative voltage is not applied includes a time during which the voltage is controlled to be zero volt in a range of from 10 $\mu$s to 10 ms, and the zero voltage time is equal to or longer than the time required by one arcing from its generation to extinction.

It is possible in principle to realize the above-mentioned methods, apparatus and the power processing portion of the present invention with use of an ordinary DC power source if such a function that the arcing at the initial stage is detected to quickly stop the output and the output is again produced after the passing of the time of the extinction of arcing, is added to a DC power source. However, when a detection circuit of arcing is actually installed in the power source, it is necessary to detect through a power source cable an abnormal condition of current or voltage supplied from the positive pole to the negative pole by the power source.

Such method of detection can only detect arcing between the cathode electrode as a target material and the anode electrode disposed near the target material. However, a slight arcing at the initial stage which starts on the surface of the cathode material can not be detected because the slight arcing is filtered by the impedance of the power source cable and the circuit constant of the power source circuit. Namely, only a relatively large arcing which is produced as a result of the slight arcing at the initial stage can be detected.

Since the time of extinction of the relatively large arcing between the cathode and anode is in the order of ms, it is necessary to stop the output from the power source for more than several ms. Further, since the size of an insulation formed on the surface of the target material at the time of generation of arcing already becomes large, the arcing occurs frequently. Accordingly, an abnormal state of output is detected from the DC power source, the shut-off of several ms is repeated, and it is very difficult to continue the normal sputtering operation.

For the above-mentioned reasons, the slight arcing can not be detected in a case that the ordinary DC power source is used for sputtering, and there will be a problem such that the shutting-off of more than several ms is repeated when a large arcing occurring subsequent to the slight arcing takes place.

SUMMARY OF THE INVENTION

The inventors of this application have found through intensive observations of the waveform of arcing that the crest value (the maximum value of the waveform of current) in initial arcing before a large arcing takes place in a series and the time of extinction of the initial arcing are substantially constant when the same apparatus is used.

Therefore, they have found that the progress of arcing in a series can be prevented by minimizing the energy of arcing. Specifically, the sputtering method comprises applying a negative voltage intermittently in a constant periodic cycle to a cathode disposed in a vacuum chamber, wherein the negative voltage is intermittently applied so that a time during which the negative voltage is not applied includes a time during which the voltage is controlled to be zero volt in a range of from 10 $\mu$s to 10 ms, and the zero voltage time is equal to or longer than the time required by one arcing from its generation to extinction.

The slight arcing can be seen with a waveform observing device such as an oscilloscope or the like.

Further, they have found through intensive observations of the waveform of arcing that a time from the application of a negative voltage to the generation of the initial arcing is substantially constant when the construction of the apparatus is the same.

Therefore, they have found that by using a voltage waveform wherein the time during which the negative voltage is intermittently applied is within a range of from 10 $\mu$s to 10 ms and is equal to or shorter than the period of time from the application of the negative voltage to the generation of arcing, the accumulation of electric charges on an insulation having a small surface area on the surface of a target can be minimized; the voltage is controlled to be zero volt before the arcing takes place, and the electric charges are neutralized by plasma near the target, whereby the frequency of occurrence of the initial arcing can be reduced.

As described above, it is possible to continue sputtering operations for a long time by specifying the time during which the voltage is controlled to zero volt, and this effect can be increased by specifying the time during which the negative voltage is intermittently applied.

DESCRIPTION OF THE PREFERRED EMBODIMENTS

Preferred embodiments of the present invention will be described with reference to the drawings.

Figure 1:
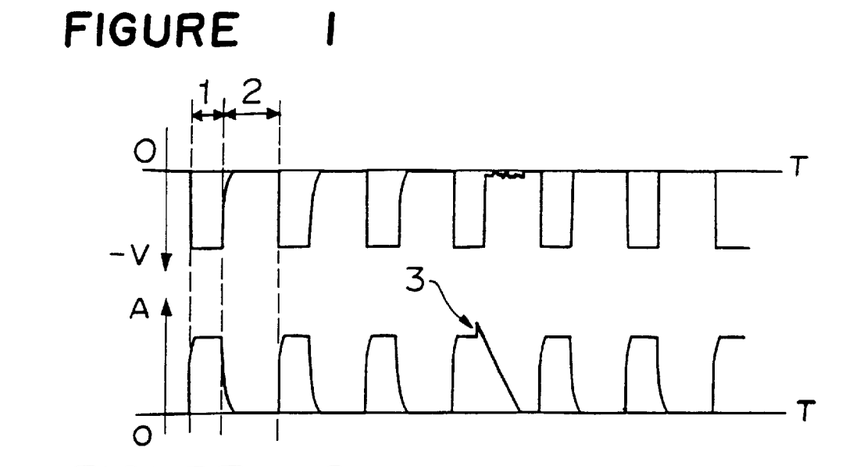
FIG. 1 is a diagram showing intermittent waveforms according to an embodiment of the present invention.

FIG. 1 shows waveforms according to an embodiment of the present invention wherein the upper portion shows a waveform of voltage and the lower portion shows a waveform of current. Reference numeral 1 indicates a time during which a negative voltage is intermittently applied (hereinbelow, referred to as an ON time), numeral 2 designates a time during which the voltage is controlled to be zero voltage (hereinbelow, referred to as a zero volt time) and numeral 3 shows a waveform produced when arcing takes place. In FIG. 1, when the zero volt time is longer than the ON time, power efficiency becomes poor. However, the waveform is simple because the power is simply turning-on and off. Accordingly, it is advantageous in construction when the power source portion has a sufficient capacity.

On the other hand, the inventors of the present invention have found that the neutralization of charging to an insulation can be effectively done in a shorter time by using a voltage waveform wherein there is a time during which a positive voltage is applied in a range of from 1 $\mu$s to 20 $\mu$s in part-of the zero volt time. By combining this waveform with the above-mentioned specified ON time, a waveform having excellent power efficiency can be obtained.

Further, they have found to suppress the occurrence of arcing for a long time and with excellent power efficiency by suitably determining the zero volt time, which is equal to or longer than the time of extinction of arcing, only just after the arcing.

Figure 2:
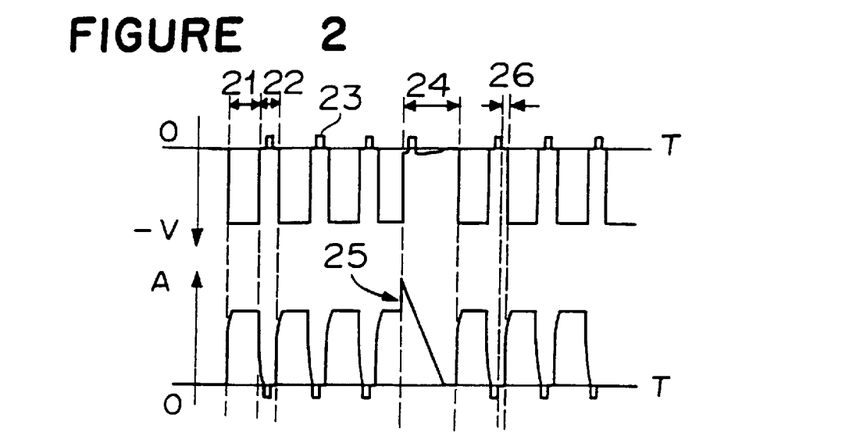
FIG. 2 is a diagram showing intermittent waveforms in a case of applying a positive potential according to an embodiment of the present invention.

FIG. 2 shows the waveform obtained by the application of a positive voltage. In FIG. 2, the upper portion shows the waveform of voltage and the lower portion shows the waveform of current. Reference numeral 21 indicates an ON time which is in a range of from 10 $\mu$s to 10 ms and which is equal to or shorter than the time from the rise of voltage to the generation of an arc discharge in the initial arcing.

Numeral 22 indicates a zero volt time, which is determined by a time 23 during which a positive potential is applied and a time 26 for a zero volt after the time 23.

The zero volt time just before the time 23 during which a positive potential is applied is preferably short. However, a constant time of 1 $\mu$s to 2 $\mu$s is actually set to protect the switching element.

It is not necessary that the time 23 during which a positive potential is applied is a long time, but it may be a time which is sufficient to apply the voltage to a large-sized target, and a time of about 5 $\mu$s to 20 $\mu$s is preferable. The value of a positive potential can be a potential sufficient to apply the voltage to an actual target, and may be 200 V or lower.

It is desirable that the zero volt time 22 can be adjusted depending on a situation of process by adjusting the time 26 after the application of a positive Potential.

Namely, a desirable result can be obtained by adjusting the zero volt time 26 so as to form the zero volt time 22 equal to or longer than the time of extinction of a slight arcing even when a slight arcing smaller than a reference value for detection set in a detection circuit takes place.

Numeral 25 indicates the waveform of arcing. The zero volt time 24 just after the occurrence of arcing is equal to or longer than the time for extinction of the arcing.

It is preferable that the above-mentioned conditions can be changed because the optimum values are different depending on the material for sputtering and the construction of the cathode electrode.

The function of the present invention is as follows.

In the present invention, by repeating ON/OFF, a potential difference on the target surface can be eliminated to prevent the occurrence of arcing. Accordingly, a stable discharge can be maintained in comparison with a conventional DC sputtering.

If arcing takes place, the arcing can be completely distinguished by giving a sufficiently long zero volt time before the voltage is ON, whereby the magnitude of the arcing can be maintained small. Further, the initial arcing appears sometime after the rise of voltage. Accordingly, a waveform wherein a time during which the voltage is controlled to be ON is in a range of from 10 $\mu$s to 10 ms and equal to or shorter than a time of from the rise of voltage to the generation of the initial arcing is used, a potential on the surface of a target is neutralized, whereby the frequency of occurrence of arcing and the magnitude of the arcing can be reduced.

By the above-mentioned function, the frequency of occurrence of the initial arcing and the magnitude of the arcing can be kept small, and a stable sputtering can be continued for a long time even with a large power.

When the waveform shown in the upper portion of FIG. 2 wherein a positive potential is added for a short time in the zero volt time is used, a potential difference on the target surface can be effectively eliminated to thereby prevent the occurrence of arcing. Accordingly, a stable discharge can be maintained for a long time in comparison with use of the ordinary DC sputtering.

Further, by determining the zero volt time 24 to be longer than the time of extinction of arcing just after the arcing 25 has been detected, the frequency of occurrence and the magnitude of the arcing at the initial stage can be kept small, and a stable sputtering can be continued for a long time even with a large power.

Even when a slight arcing whose value is smaller than a reference value of detection set in the detection circuit takes place, a further stable sputtering can be continued by adjusting the zero volt time 26 so that the zero volt time 22 is longer than the time of extinction of the slight arcing.

Figure 3:
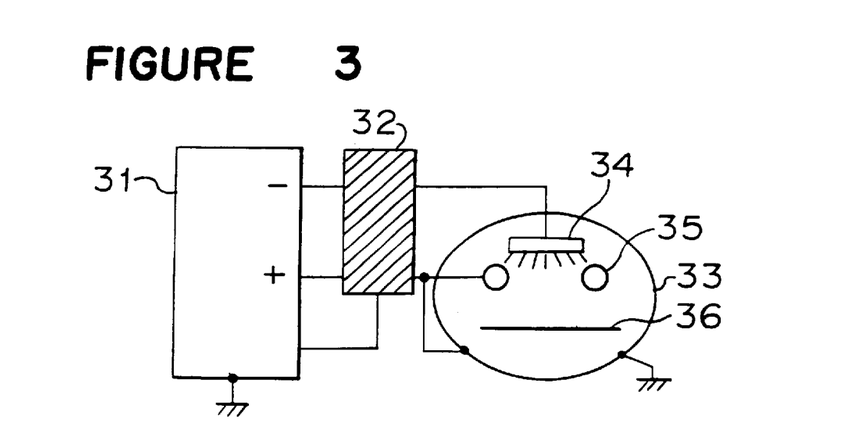
FIG. 3 is a diagram showing a sputtering apparatus according to a first embodiment of the present invention.

FIG. 3 shows an embodiment of the power source device for realizing the above-mentioned sputtering method.

The power source device of the present invention preferably has a sputtering power generating portion and a power processing portion which should be separately disposed. In FIG. 3, numeral 31 designates a sputtering power generating portion, numeral 32 designates a power processing portion, numeral 33 designates a vacuum chamber, numeral 34 designates a cathode electrode, numeral 35 designate anode electrodes and numeral 36 designates a substrate.

In this embodiment, the power processing portion 32 can be disposed closer to the cathode electrode 34 than the sputtering power generating portion 31, whereby the length of a power source cable between the output terminal of the power processing portion 32 and the cathode electrode 34 can be the shortest to thereby minimize the inductance of the power source cable. Accordingly, the waveform of an intermittent DC voltage can be applied to the cathode electrode 34 without any distortion.

Figure 4:
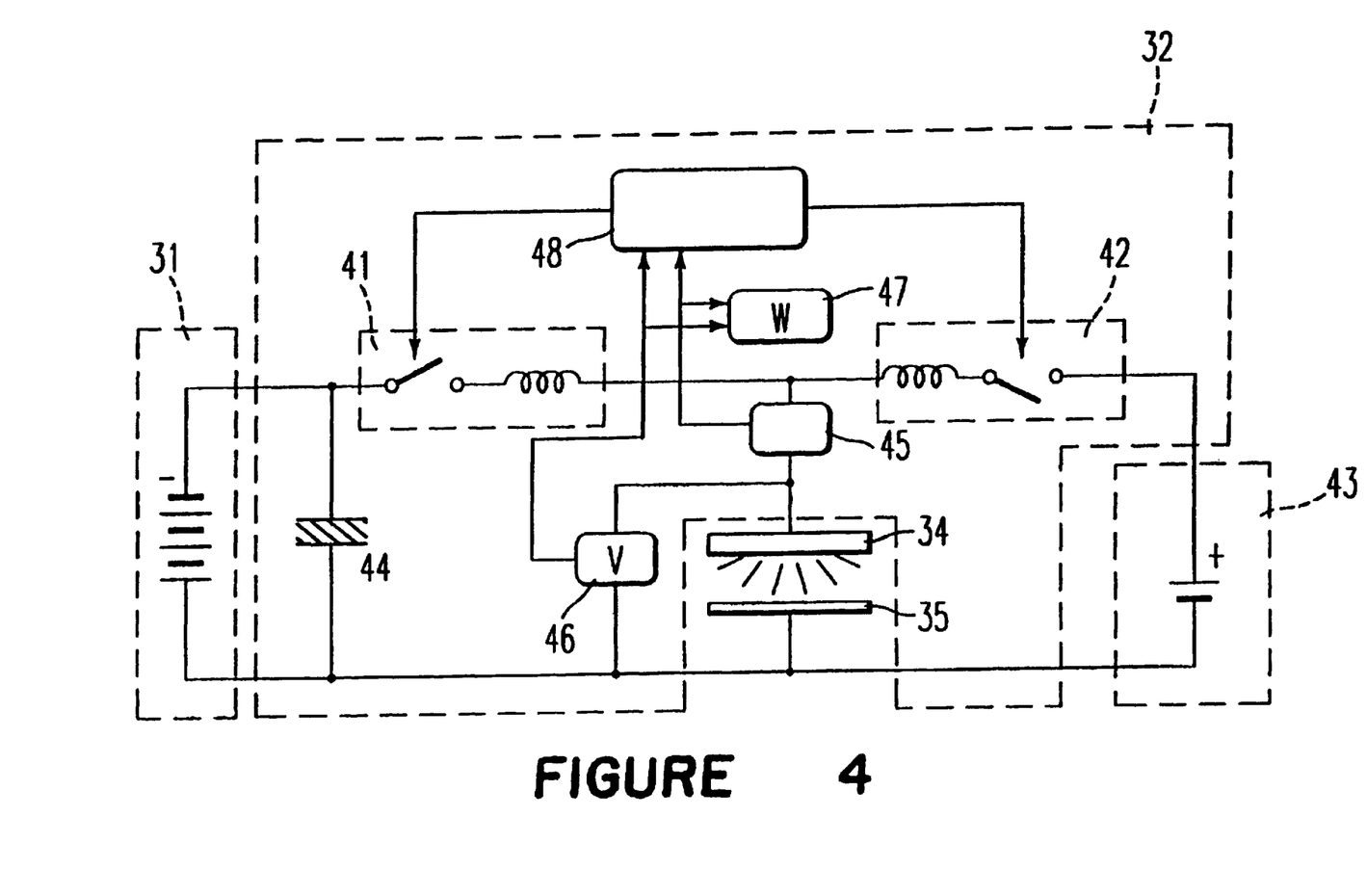
FIG. 4 is a circuit diagram showing an embodiment of an intermittent power processing portion of the present invention.

FIG. 4 shows the construction of the power processing portion 32 of the present invention.

The power processing portion 32 comprises a first switching circuit 41 as main circuit, a second switching circuit Δfor applying a positive potential, a control circuit or control unit 48 for a switching element for controlling the first and second circuits and measuring circuits 45–47 for measuring current (45), voltage (46), and power (47) for sputtering.

The first switching circuit 41 is connected in series between the negative pole of the sputtering voltage generating portion 31 and the cathode electrode 34. The first switching circuit 41 is composed of a semiconductor switching device and a coil for protecting the same and is operable to change a sputtering power to an intermittent power. It has a switching speed of 10 μs (100 kHz) for ON/OFF. The second switching circuit 42 is composed of a semiconductor switching device and a coil for protecting the same, and is so operable that power of DC power source 43 which supplies an optional value of positive potential to the cathode electrode 34 is applied to the cathode electrode 34, beside of the sputtering power generating portions 31.

The second switching circuit 42 is operated only when the first switching circuit 41 as the main circuit is an OFF state. A time of applying a positive potential in an ON state can be about 20 μs in maximum.

It is preferable that the power source 43 for applying a positive potential is of about 200 V in maximum, but it can be determined optionally.

By adjusting a turning on time of the semiconductor switching device of the second switching circuit 42 to be about 20 μs or less immediately after the semiconductor switching circuit of the first switching circuit 41 has been turning off, a positive potential of about 200 V or less can be applied to the cathode electrode 34, whereby the occurrence of arcing can be suppressed and the waveform having excellent power efficiency as shown in FIG. 2 can be produced.

The control circuit (48) for the semiconductor switching device is capable of controlling the turning-on time to be 5 μs or more for the first switching circuit and the turning-off time to be 5 μs or more for the same, and capable of turning-on the second switching circuit for less than the time of turning-off the first switching circuit and within a range of from 1 μs to 20 μs when the first switching circuit is turned off.

It is possible that the first switching circuit is in a normally ON state while omitting the zero volt time. The adjustment allows to use the conventional DC sputtering.

The circuit 45–47 for measuring current, voltage or power for sputtering function to measure a current value, a voltage value and a power value effective to the sputtering and also function to compare the measured values with predetermined reference values to detect arcing. In this case, it is especially effective to judge whether the current value or both the current value and the voltage value are higher or lower.

The control circuit 48 for the semiconductor switching device functions to control the zero volt time 24 immediately after the occurrence of arcing. The zero volt time can be optionally set to be in a range of from 100 μs to 10 ms.

Further, when the arcing is detected upon the judgement as to whether or not the sputtering current value or voltage value (or the impedance at the arcing) is higher or lower, the semiconductor switching device of the switching circuit 41 operates so that the zero volt time is longer than the time of extinction of arcing, only immediately after the arcing, whereby the magnitude of arcing can be minimized and a stable sputtering can be continued for a long time.

Further, a smoothing circuit 44 is preferably disposed at the side of the input terminal of the power processing portion, whereby the waveforms of voltage and current at the output terminal of the power generating portion 31 can be substantially in a direct current form.

The power generating portion generally has a function to feed-back the voltage, current or power at the output terminal so that it can be kept constant. The function may cause hunting on controlling.

However, since the hunting can be prevented by the smoothing circuit 44, the ordinary DC power source can be used. Accordingly, the ordinary sputtering DC power source may be used for the sputtering power generating portion 31. In this case, the present invention can be practiced with a conventional sputtering apparatus with the power processing portion 32.

In the sputtering method of the present invention, it is preferable to measure and display the average value of power per period (hereinafter referred to as the effective value, see formula 1 given hereinafter). By displaying the effective value, the film-deposition rate can be controlled in the same manner as use of the power for the conventional DC sputtering even when any type of waveform is used for sputtering.

Further, it is preferable that the effective value is fed-back to the sputtering power generating portion 31 for a constant voltage control, a constant current control or a constant power control.

When a sputtering apparatus having a plurality of cathode electrodes disposed in a vacuum chamber is used and an intermittent power waveform is supplied to each of the cathode electrode, interference such as a beat may appear. Accordingly, the power processing portion should have a function to shift the phase of waveform.

Figure 8:
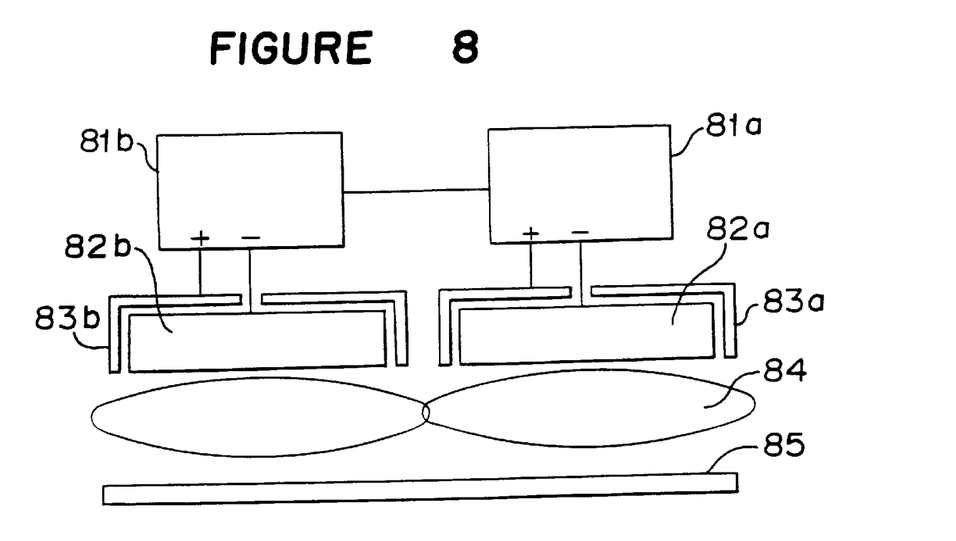
FIG. 8 is a diagram showing the sputtering apparatus according to a third embodiment of the present invention.

FIG. 8 shows an embodiment of the sputtering apparatus of the present invention. In this embodiment, two cathode electrodes 82a, 82b and anode electrodes 83a, 83b are disposed in a vacuum chamber so that sputtering is conducted simultaneously to a substrate 85. Power generating means 81a and 81b supply power intermittently wherein the phases of voltage waveform are shifted to each other, whereby interference of plasma such as a beat or the like can be eliminated and a stable plasma 84 is produced.

Further, the waveforms shown in FIG. 1 or FIG. 2 can be produced by combining the apparatus with the power source as shown in FIG. 3. Thus, the optimum waveform can be supplied by satisfying the conditions of process.

In the sputtering apparatus of the present invention, the frequency of occurrence of arcing can be reduced even when a reactive sputtering is conducted. Further, a larger power can be supplied to the cathode stably, and the optimum intermittent power can be expected and supplied to meet various sputtering processes. Accordingly, the sputtering apparatus of the present invention has high ability of film-deposition.

A thin film composed mainly of silicon oxide formed by the sputtering method of the present invention is of higher quality than a thin film obtained by a DC sputtering.

The thin film composed mainly of silicon oxide formed by the sputtering method and the sputtering apparatus of the present invention is of high quality since no arcing takes place during the sputtering so that attachment of particles is little. Further, it is believed that since there is no fluctuation in the sputtering condition due to arcing, a uniform film with little microscopic defects can be obtained. Further, it is believed that excellent film quality with little defects can be obtained, since sputtering is carried out intermittently with an interval of every period, whereby a very thin film is intermittently formed on the substrate with an interval of every period, and film-deposition is carried out while an oxidation reaction on the substrate is completed during every period.

Thus, it is possible to obtain an excellent thin film composed mainly of silicon oxide which has little defects macroscopically or microscopically, whereby a high alkali barrier property can be obtained even when the film is formed on a low temperature substrate.

A thin film composed mainly of silicon nitride formed by the sputtering method or the sputtering apparatus of the present invention is of higher quality than a thin film obtained by the DC sputtering.

The thin film composed mainly of silicon nitride formed by the sputtering method of the present invention is of high quality since it is unnecessary to heat the substrate, no arcing takes place during the sputtering so that attachment of particles is little. Further, it is believed that since there is no fluctuation in the sputtering condition due to arcing, a uniform film with little microscopic defects can be obtained. Further, it is believed that excellent film quality with little defects can be obtained, since sputtering is carried out intermittently with an interval of every period, whereby a very thin film is intermittently formed on the substrate with an interval of every period, and film-deposition is carried out while a nitriding reaction on the substrate is completed during every period.

Thus, it is possible to obtain an excellent thin film composed mainly of silicon nitride which has little defects macroscopically or microscopically, whereby a high alkali barrier property can be obtained even when the film is formed on a low temperature substrate.

If the concentration of nitrogen in sputtering gas is adjusted and/or power to be supplied to a silicon target is adjusted so that the composition ratio of silicon nitride (atomic molar ratio of N/Si) will be within a range of from 1.25 to 1.36, it is possible to produce silicon nitride having an excellent alkali barrier property.

In the film-deposition method of a transparent conductive film by the sputtering method of the present invention, a negative voltage is intermittently applied and power of a large power density is instantaneously supplied, and at the same time, problems of nodules of sub oxide on the target material which reduce the sputtering rate and an arcing in sputtering can be eliminated. Thus, the film-deposition method of the present invention is excellent in productivity.

As sputtering targets, there are a sputtering target composed mainly of tin or tin oxide containing metal antimony or an antimony compound, a sputtering target composed mainly of indium or indium oxide containing tin and a sputtering target composed mainly of zinc or zinc oxide containing a simple substance or a compound of at least one metal selected from the group consisting of aluminum, gallium, indium, boron and silicon.

Sputtering power used for the method and apparatus of the present invention is preferably have a voltage waveform to be applied to a target, as shown in FIG. 1 wherein an application time of negative voltage is in a range of from 10 $\mu$s to 10 ms and a non-application time is in a range of from 10 $\mu$s to 100 ms, or a voltage waveform to be applied to a target as shown in FIG. 2 wherein an application time of negative voltage is in a range of from 10 $\mu$s to 10 ms and an application time of negative voltage and a non-application time is in a range of from 10 $\mu$s to 100 ms. Further, setting of the value of negative voltage ($-V_N$ in FIG. 9) is important for suppressing formation of nodules, which is an object of the present invention. As expressed in formula 5, arcing and formation of nodules of sub oxide on the target surface can be effectively suppressed by adjusting the negative application voltage ($-V_N$) so that the average value $W_A$ of the intermittently supplied power is from 2 to 10 times the average value W of the power per period (hereinafter referred to as the effective value W).

The effective value W of the power is as represented by the formula 1 where T is the period. If this is applied to the case of the waveform as shown in FIG. 2, W is as shown by the formula 2.

On the other hand, the average power $W_A$ within the time when sputtering actually takes place (when the negative voltage is applied) ($a_1$ in FIG. 9) are as shown by the formula 3. Further, in FIG. 2, the average voltage is $V_A=(-V_N)$, and if this is inserted, $W_a$ is as shown by the formula 4. To effectively remove nodules, it is preferred that the average value $W_A$ of power is from 2 to 10 times the effective value W of the power, as shown by the formula 5. If this is applied to the case of the waveform as shown in FIG. 2, the formula 6 is obtained. Therefore, ($-V_N$), $a_1$ (10 $\mu$s$\leq a_1 \leq$10 ms), and $b_1$ (10 $\mu$s$\leq b_1 \leq$100 ms) should be adjusted to satisfy the formula 6.

Good results can be obtained especially when the average value of intermittent electric power density $\omega_A$ (see formula 7) is within a range of from 2.5 W/cm$^2$ to 30 W/cm$^2$.

Figure 9:
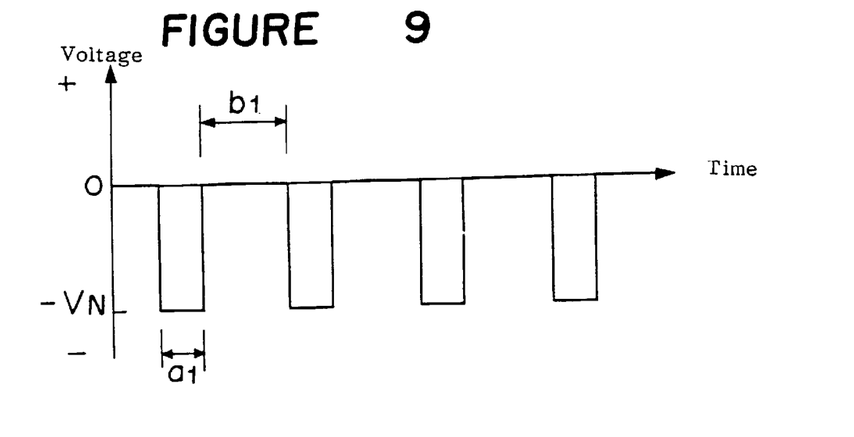
FIG. 9 is a diagram showing an intermittent waveform of an embodiment of the present invention.

In this case, the waveform may not be necessarily be a precise rectangular waveform as shown in FIG. 9, and ($-V_n$), $a_1$ and $b_1$ may be optimized depending upon the size and condition of the target and the particular apparatus.

Figure 10:
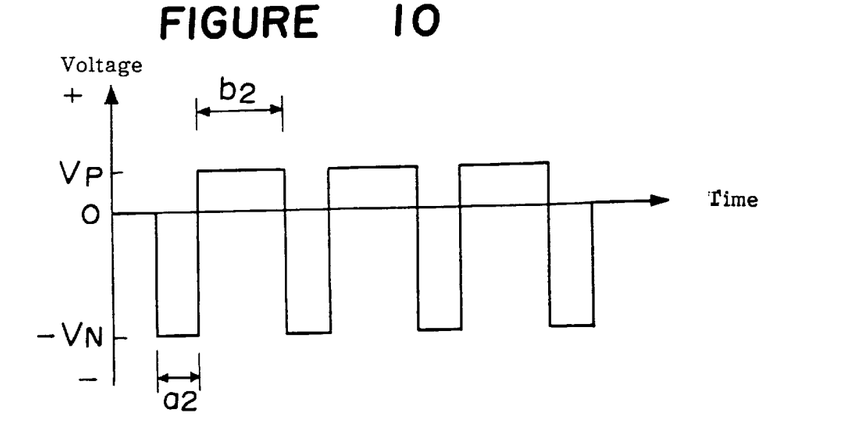
FIG. 10 is a diagram showing an intermittent waveform according to an embodiment of the present invention.
Figure 11:
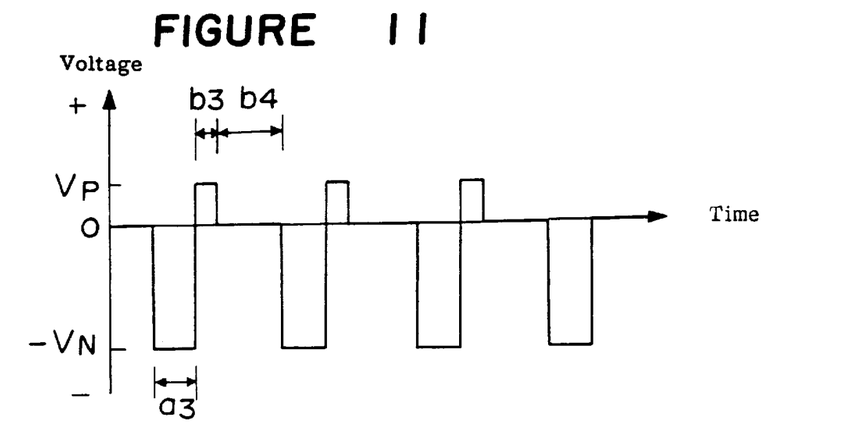
FIG. 11 is a diagram showing an intermittent waveform according to an embodiment of the present invention.

In a case where positive voltage is applied as shown in FIG. 10 or 11, application of such positive voltage does not serve effectively for sputtering, and accordingly, in the calculation of the formulas 1 to 7, $V_p$ is to be taken as 0.

The film-deposition rate of the transparent conductive film can easily be controlled by the effective value W of the intermittently supplied sputtering power. For example, in a case where by the method of the present invention, it is intended to obtain the desired film-deposition rate obtained by the conventional DC sputtering method, the desired film-deposition rate can be obtained by adjusting the effective value W of the intermittently supplied power to the same level as the DC electric power value.

Namely, an equation of "the film-deposition rate by the conventional DC sputtering method/the DC power=the film-deposition rate according to the present invention/the effective value W of power" substantially holds good.

Thus, the film-deposition rate can be adjusted by adjusting the zero volt time so that the effective power value W corresponds to the power of the conventional DC sputtering, and the quality of a film deposited on the substrate can be kept and a stable sputtering is obtained for a long time.

$$W = \frac{1}{T}\int_0^T V(t)I(t)dt \quad \text{Formula 1}$$

$$W = \frac{(-V_N)}{a_1 \div b_1}\int_0^{a_1} I(t)dt \quad \text{Formula 2}$$

$$W_A = \frac{1}{a_1}\int_0^{a_1} V(t)I(t)dt \quad \text{Formula 3}$$

$$W_A = \frac{-V_N}{a_1}\int_0^{a_1} I(t)dt \quad \text{Formula 4}$$

$$2W \leq W_A \leq 10W \quad \text{Formula 5}$$

$$2 \leq \frac{W_A}{W} = \frac{a_1 + b_1}{a_1} \leq 10 \quad \text{Formula 6}$$

$$\omega_A = \frac{W_A}{S} \quad S: \text{Target surface area} \quad \text{Formula 7}$$

Target surface area

Now, the present invention will be described in detail with reference to Examples. However, it should be understood that the present invention is by no means restricted by such specific Examples.

EXAMPLE 1

Figure 5:
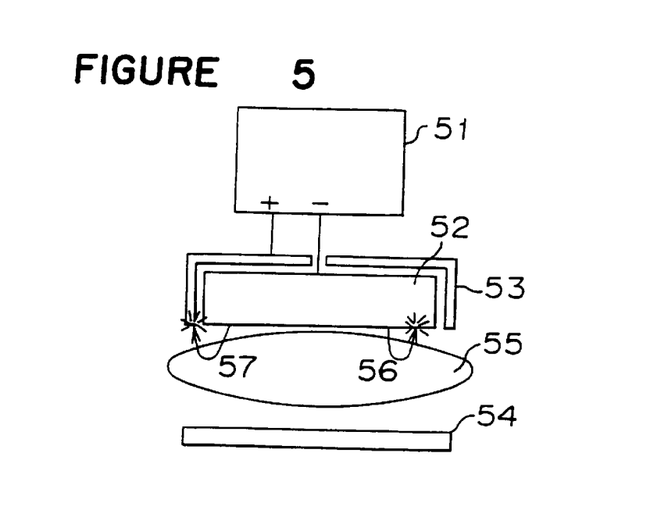
FIG. 5 is a diagram showing the sputtering apparatus according to a second embodiment of the present invention.

FIG. 5 shows an example of the sputtering apparatus of the present invention.

In FIG. 5, reference numeral 51 designates a DC power source for generating intermittently a negative DC voltage, numeral 52 designates a cathode electrode with a target material, numeral 53 designates an anode electrode, numeral 54 designates a substrate to be subjected to a film-deposition treatment, numeral 55 designates an area of glow discharge effective to sputtering, numeral 56 designates a slight arcing produced on the surface of the target and numeral 57 designates arcing produced between the cathode electrode and the anode electrode.

In the present invention, output from the DC power source generating an intermittent DC voltage may not be of a rectangular wave, but may be of a trapezoidal, a triangular or a sign waveform to obtain the same effect. Further, in construction of the power source circuit, the waveform can be produced by oscillation in the power source itself or the output of the DC power source may be processed by a semiconductor switching element to form an intermittent waveform. In either case, the effect of the present invention is the same.

In the apparatus having the construction shown in FIG. 5, using a planar magnetron cathode having an area of 10×80 cm, a target material of boron-doped silicon, and a gas mixture of argon and oxygen having a ratio of 1:1, as introducing gas, a film of $SiO_2$ doped with boron was deposited by sputtering on a substrate under a discharging pressure of $3.0 \times 10^{-3}$ Torr and an effective power value of 2 kW. When a DC discharge was conducted, arcing suddenly and frequently took place after about 2 minutes and 30 seconds and the sputtering could not be continued.

Sputtering was conducted in the same manner as above except that an intermittent direct current was used wherein in the waveform shown in the upper portion of FIG. 1, an ON time during which a negative voltage is applied was 100 μs and a zero volt time was 40 μs. As a result, arcing gradually increased and the frequency of occurrence of the arcing after about 30 minutes was about 60 times/min.

In observing the current waveform during arcing and measuring a time of extinction of the initial arcing, there was detected 160 to 180 μs.

Sputtering was conducted in the same manner as above except that an intermittent direct current was used wherein the ON time was 100 μs and the zero volt time was 200 μs. As a result, the frequency of occurrence of arcing after about 60 min was about 60 times/min. In this case, the initial arcing frequently took place after 90 μs to 100 μs of the rise of voltage.

Figure 6:
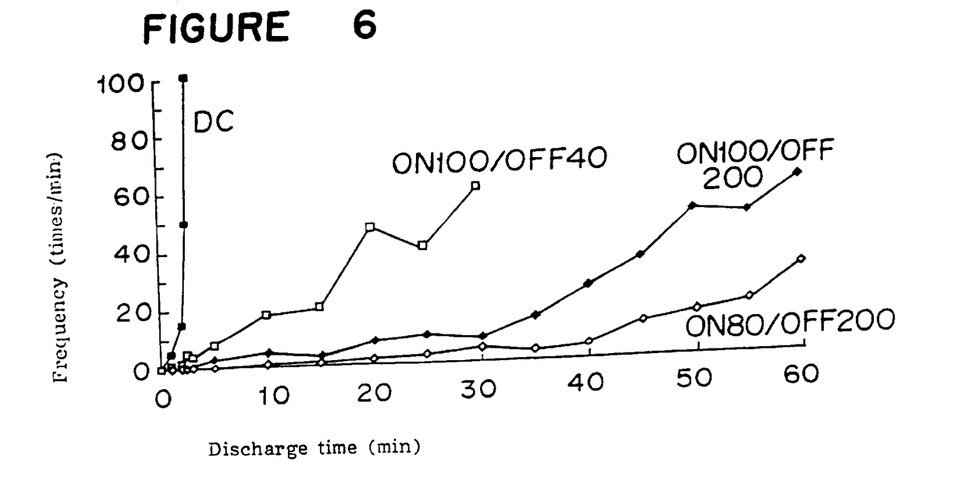
FIG. 6 is a first graph showing the effect of the present invention.
Figure 7:
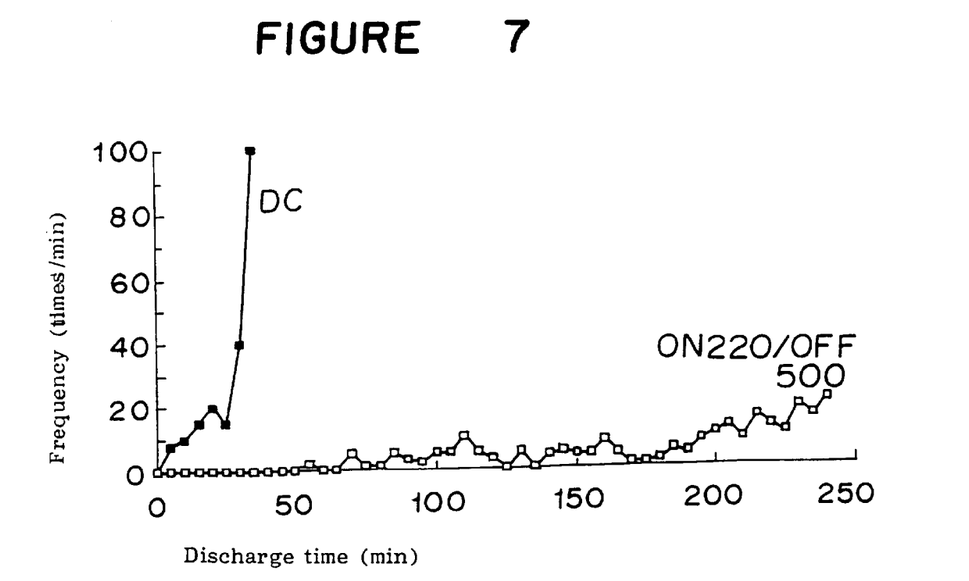
FIG. 7 is a second graph showing the effect of the present invention.

Sputtering was conducted in the same manner as above except that an intermittent direct current was used wherein the ON time was 80 μs and the zero volt time was 200 μs. There was found that the frequency of occurrence of arcing after about 60 min was about 30 times/min. The frequency of occurrence of arcing in the above-mentioned four tests is shown in FIG. 6. In the measurement of arcing, a current value 10% or more than the maximum value of ordinary current waveform was used as a detection level in the oscilloscope and the number of occurrence detected was recorded.

EXAMPLE 2

A cathode having an area of 40×300 cm, aluminum-doped silicon as a target material and a gas mixture of argon and oxygen having a ratio of 2:10 as introducing gas were used in the apparatus shown in FIG. 5. Sputtering was conducted under a discharge pressure of $2.0 \times 10^{-3}$ Torr and at an effective power value of 13 kW to deposit a film of $SiO_2$ doped with aluminum on a substrate.

When a direct current was used for discharge, arcing suddenly took place after about 35 min and the sputtering could not be continued. In observing the waveform during the discharge, a time of extinction of the initial arcing was about 400 μs.

Sputtering was conducted in the same manner as above except that the waveform shown in the upper portion of, FIG. 1 was used wherein the zero volt time was 500 μs and the ON time was 500 μs. A time required for the occurrence of the initial arcing was about 220 μs after the rise of voltage.

Sputtering was conducted in the same manner as above except that the ON time was 220 μs and the zero volt time was 500 μs. The frequency of occurrence of arcing was 20 times/min or lower even after the lapse of 4 hrs.

The frequency of occurrence of arcing in the case of using a direct current and the case of using the intermittent waveform wherein the ON time is 220 μs and the zero volt time is 500 μs is shown in FIG. 8. The condition of detecting arcing is the same as that of Example 1.

EXAMPLE 3

In a vacuum chamber, N-type silicon (phosphorus doped single crystal) having a specific resistance of 1.2 Ω·cm was placed as a target on a cathode, and on the opposite side of the target, a soda lime glass sheet was disposed as a substrate. The vacuum chamber was evacuated to $1 \times 10^{-5}$ Torr. Then, a gas mixture of argon and oxygen was introduced as sputtering gas, and conductance was adjusted so that the pressure is $2 \times 10^{-3}$ Torr.

Then, the voltage as shown in the upper portion of FIG. 2 was applied to the cathode. Here, the ON time 21 was 50

μs which is the same as the time of starting the initial arcing and the zero volt time 22 was 50 μs which is the same as the time of extinction of the initial arcing in which the time 23 for applying a positive potential was about 12 μs. Here, the negative voltage was adjusted so that the application power in the application of this voltage was 500 W. The positive voltage was kept to be 100 V.

The substrate temperature was maintained to be at room temperature, and an electric discharge was started at an oxygen concentration in the sputtering gas of 60%. After the pre-discharge of 5 min, the shutter was opened, and the film-deposition time was adjusted so that the thickness of film was 250 Å, whereby a thin film composed mainly of silicon oxide was deposited on a soda lime glass substrate.

When 120 min passed after the initiation of discharge, a film was deposited on another soda lime glass substrate. However, little arcing was observed.

COMPARATIVE EXAMPLE 1

Sputtering was conducted to deposit a film in the same manner as Example 3 except that an intermittent DC voltage having the waveform as shown in the upper portion of FIG. 1 was applied to the cathode wherein the ON time was 50 μs and the zero volt time was 25 μs.

Although little arcing was observed just after the initiation of film-deposition, occurrence of arcing was observed with the lapse of time, and continuous discharge of red-hot particles was observed on the target surface at the completion of film-deposition.

When 120 min passed after the initiation of discharge, a film was deposited on another soda lime glass substrate. Arcing took place very frequently.

COMPARATIVE EXAMPLE 2

Sputtering was conducted in the same manner as Example 3 except that a radio frequency voltage of 13.56 MHz was applied to the cathode.

After 120 min from the initiation of discharge, a film was deposited on another soda lime glass substrate. In this case, there was no arcing.

The coated side of each of the coated glass obtained in Example 3 and Comparative Examples 1 and 2 was contacted with pure water at 90° C. for 24 hours, whereupon the amount of out diffused sodium atoms ($\mu g/cm^2$) in this pure water was measured by atomic absorptiometry. Results are shown in Table 1.

TABLE 1

| | Film-deposition after 5 min from initiation of discharge | Film-deposition after 120 min from initiation of discharge |
|---|---|---|
| Example 3 | 0.02 | 0.02 |
| Comparative Example 1 | 1.3 | 5.6 |
| Comparative Example 2 | 0.32 | 0.31 |

As is clear from the above Example and Comparative Examples, according to the present invention, it is possible to form a thin film of silicon oxide having a high alkali barrier property without heating the substrate for a long period of time and in a stable manner. Further, since the film-deposition is conducted by the DC sputtering, deposition of a film with a large area or a film-deposition at a high speed can be facilitated, whereby application to e.g. a transparent conductive substrate for liquid crystal can be made possible on an industrial production scale.

EXAMPLE 4

N-type silicon having a specific resistance of 1.2 Ω·cm and a surface area of 160 mm×40 mm was used as a target, and the voltage as shown in the upper portion of FIG. 2 was applied to the targets. Here, the negative voltage was adjusted so that the application power in the application of this voltage was 200 W. The positive voltage was kept to be 100 V. Other conditions was the same as those of Example 3.

Discharge was started at an oxygen concentration in sputtering gas of 40%. After 5 min, the shutter was opened to deposit a film of silicon nitride having a thickness of 200 Å on a flat soda lime silicate glass at room temperature.

Then, when 120 min passed after the initiation of discharge, the shutter was again opened to deposit a silicon nitride film of 200 Å on another soda lime glass substrate. During the film-deposition operations, no arcing was observed.

COMPARATIVE EXAMPLE 3

Sputtering was conducted in the same manner as in Example 4 except for application of a DC power of 200 W. In film-deposition after 5 min from the initiation of discharge, no arcing was observed.

After 120 min from the initiation of discharge, film-deposition was conducted on another soda lime glass substrate. In this case, arcing frequently took place, and discharge of red-hot particles from the target surface was observed.

COMPARATIVE EXAMPLE 4

Sputtering was conducted in the same manner as in Example 4 except N-type silicon having a specific resistance of 1.5 Ω·cm and a diameter of 6 inches was used as a target, the nitrogen concentration in sputtering gas was adjusted to 100%, and a radio frequency voltage of 13.56 MHz was applied so that a power of 300 W was supplied.

When 120 min passed after the initiation of discharge, a film was deposited on another soda lime glass substrate. No arcing was observed.

COMPARATIVE EXAMPLE 5

Films of silicon nitride each having a film thickness of 200 Å were deposited on flat soda lime silicate glass substrates at a temperature of about 600° C. by CVD method in each case that the ratio of ammonia gas/silane gas in material gas was 3, 5, 10 or 15.

The coated side of each of the coated glass obtained by Example 4 and Comparative Examples 3 to 5 was contacted with pure water at 90° C. for 24 hours, whereupon the amount of sodium atom out diffused into the pure water from soda lime glass through silicon nitride film was measured by atomic absorptiometry. The results of Example 4 and Comparative Examples 3 and 4 are shown in Table 2 and the results of Comparative Example 5 are shown in Table 3.

TABLE 2

| | Film-deposition after 5 min from initiation of discharge | | Film-deposition after 120 min from initiation of discharge | |
|---|---|---|---|---|
| | Composition (N/Si) | Amount of out diffused Na ($\mu$g/cm$^2$) | Composition (N/Si) | Amount of out diffused Na ($\mu$g/cm$^2$) |
| Example 4 | 1.33 | 0.005 | 1.33 | 0.005 |
| Comparative Example 3 | 1.33 | 0.008 | 1.32 | 0.91 |
| Comparative Example 4 | 1.36 | 0.015 | 1.36 | 0.015 |

TABLE 3

| Ratio of ammonia/silane | 3 | 5 | 10 | 15 |
|---|---|---|---|---|
| Composition (N/si) | 1.27 | 1.36 | 1.49 | 1.56 |
| Amount of out diffused Na ($\mu$g/cm$^2$) | 0.047 | 0.038 | 0.056 | 0.062 |

In comparing Examples with Comparative Examples described above, silicon nitride film deposited by the present invention shows that the amount of out diffused sodium atoms through this film is low, and there is clear superiority in the present invention.

Further, it is understood that the silicon nitride film having a high alkali barrier property can be deposited stably for a long period of time.

Further, it becomes possible to deposit a silicon nitride film having a high alkali barrier property without heating the substrate, and coating of alkali barrier on a substrate having a low heat resistance is possible.

EXAMPLE 5

By using an ordinary magnetron sputtering device as shown in FIG. 5, the voltage as shown in the upper portion of FIG. 1 wherein the ON time was 100 $\mu$s and the zero volt time was 400 $\mu$s, was applied to an indium oxide target 52 containing 10 wt % of tin. As a substrate 54 on which a film is to be deposited, non-alkali glass (AN glass by Asahi Glass Company Ltd.) previously heated to 200° C. was used.

A film-deposition chamber was evacuated to 1×10$^{-5}$ Torr or lower. Then, argon gas containing 1 vol % of oxygen gas was introduced so that gas pressure was 3×10$^{-3}$ Torr. Sputtering power was adjusted to be 1.1 kW in terms of effective value.

EXAMPLE 6

Sputtering was conducted in the same manner as in Example 5 except that the voltage as shown in FIG. 2 wherein the ON time 21 was 100 $\mu$s, the application time of positive voltage 23 having an amplitude of about 10% to the power value in the application of a negative voltage was 10 $\mu$s and the zero volt time 26 was 390 $\mu$s.

COMPARATIVE EXAMPLE 6

Sputtering was conducted in the same manner as in Example 5 except that the conventional magnetron sputtering apparatus and the conventional DC sputtering power source were used.

Occurrence of nodules after continuous sputtering of 23 hours, the frequency of occurrence of arcing and the characteristic of ITO films were examined on Examples 5 and 6 and Comparative Example 6.

TABLE 4

| | Comparative Example 6 | Example 5 | Example 6 |
|---|---|---|---|
| Formation of nodules (after sputtering for 23 hours) | Many nodules were observed the entire erosion region except for the erosion center | Almost nil | Almost nil |
| Frequency of arcing (after film-sputtering for 23 hours) | 15 times/min or more | 3 times/min or less | Once/min or less |
| Specific resistance of ITO film (Å · cm) Immediately after initiation of film-sputtering | 1.9 × 10$^{-4}$ | 1.9 × 10$^{-4}$ | 1.9 × 10$^{-4}$ |
| Specific resistance of ITO film (after film-sputtering for 23 hours) | 4.0 × 10$^{-4}$ | 2.0 × 10$^{-4}$ | 1.9 × 10$^{-4}$ |
| Change in the sputtering rate (after sputtering for 23 hours) | Decreased by about 40% | Almost nil | Almost nil |

As seen in Table 4, occurrence of nodules is slight even after continuous sputtering for 23 hours (a target of a thickness of 6 mm was completely digged down) and there is no substantial reduction in sputtering rate. Further, the frequency of occurrence of arcing is reduced to about ⅕–⅓ in comparison with the conventional sputtering method shown in Comparative Examples. The specific resistance of ITO film is substantially the same as that of a sample by the conventional sputtering method.

In Comparative Examples, the decrease of the sputtering rate was remarkable by about 40%. The specific resistance is reduced from 1.9×10$^{-4}$ Ω·cm (at the initial stage of sputtering) to 4×10$^{-4}$ Ω·cm due to the reduction of sputtering rate. Nodules were very rigid and it was necessary to conduct mechanical grinding for cleaning.

The film-deposition method for a transparent conductive film and the film-deposition apparatus of the present invention exhibit excellent effect in depositing a transparent conductive film without stopping film-deposition steps, which reduce productivity, and to suppress occurrence of nodules of sub oxide on the target surface which causes reduction in sputtering rate. Further, it provides excellent effect to suppress arcing which causes defects in the transparent conductive film. Since arcing can be suppressed, a large electric power can be used and a high film-deposition rate is obtainable in comparison with the conventional DC sputtering method.

Further, use of the power processing portion of the present invention suppresses arcing without adding an arcing preventing circuit which is used for a conventional DC sputtering power source. Further, by controlling the effective value of intermittently supplied power, conditions for film-deposition can be controlled in the same manner as the conventional DC sputtering method, and a transparent conductive film having the same property as the conventional film can be obtained.

In accordance with the present invention, since a potential difference on the target surface is eliminated and occurrence of arcing is prevented, a stable discharge can be maintained in comparison with a conventional DC sputtering.

The frequency of occurrence and the scale of initial arcing can be small, a stable sputtering can be continued for a long period of time even when a large power is used. Further, excellent efficiency of electric power is obtainable.

The sputtering apparatus of the present invention can reduce the frequency of occurrence of arcing even in a case of reactive sputtering, and a large electric power can be supplied stably to the cathode. Accordingly, it has high film-deposition ability.

The power processing portion of the present invention is of a simple structure and is applicable to a conventional sputtering apparatus so that sputtering by a pulse-like intermittent DC power can be realized.

By using the power processing portion of the present invention, an intermittent voltage waveform can be easily optimized depending on the size of apparatus, material, electric power used and the scale of initial arcing.

In the film-deposition method of a thin film composed mainly of silicon oxide according to the present invention, since arcing is not generated during film-deposition, a film having high quality and little attachment of particles can be obtained.

Further, in the film-deposition method of a thin film composed mainly of silicon nitride according to the present invention, since arcing is not generated during film-deposition, a thin film of high quality and little attachment of particles can be obtained.

The film-deposition method for an ITO film of the present invention can provide stable operations for a long period of time because arcing can be prevented and occurrence of nodules of sub oxide formed on the target surface can be suppressed while the quality of a film and the film-deposition rate are the same as those obtained by the conventional DC sputtering method.

We claim:

1. A sputtering method using a power processing portion including a first switching circuit connected in series between a negative pole of a sputtering power generating portion and a cathode disposed in a vacuum, and a second switching circuit connected in series between the cathode and a DC power source other than the sputtering power generating portion for supplying a positive potential to the cathode, the method comprising the steps of:

controlling a turning-on time and a turning-off time of the first switching circuit so that a negative voltage is intermittently applied in a constant periodic cycle to the cathode;

controlling the turning-on time and the turning-off time of the first switching circuit so that a time during which the negative voltage is not applied includes a time during which the voltage is zero volts in a range of from 10 $\mu$s to 10 ms, and the zero voltage time is a time required by one arcing from its generation to extinction or longer; and controlling a turning-on time of the second switching circuit during the time which the voltage is controlled to be zero volts to include a period of time during which a positive voltage is applied within a range of from 1 $\mu$s to 20 $\mu$s.

2. The sputtering method according to claim 1, wherein a time during which the negative voltage is applied is within a range of from 10 $\mu$s to 10 ms and is equal to or shorter than a period of time from the application of the negative voltage to a generation of arcing.

3. The sputtering method according to claim 1, wherein the time during which the voltage is controlled to be zero volts is immediately after arcing.

4. The sputtering method according to claim 1, wherein an amplitude of said positive voltage is approximately 10% of the amplitude of the negative voltage.

5. A sputtering apparatus comprising:

a cathode disposed in a vacuum chamber;

a sputtering power generating portion; and a power processing portion including a control mechanism configured to control the power processing portion, a first switching circuit connected in series between a negative pole of the sputtering power generating portion and the cathode, and a second switching circuit connected in series between the cathode and a DC power source other than the sputtering power generating portion for supplying a positive potential to the cathode, wherein the control mechanism controls a turning-on time and a turning-off time of the first switching circuit so that the cathode is applied with an intermittent negative voltage, controls the turning-on time and the turning-off time of the first switching circuit so that a time during which the negative voltage is not applied includes a time during which the voltage is zero volts in a range of from 10 $\mu$s to 10 ms, and the zero voltage time is a time required by one arcing from its generation to extinction or longer, and controls a turning-on time of the second switching circuit during the time which the voltage is controlled to be zero volts to include a period of time during which a positive voltage is applied within a range of from 1 $\mu$s to 20 $\mu$s.

6. The sputtering apparatus according to claim 5, wherein the power processing portion is disposed closer to the cathode than the sputtering power generating portion.

7. The sputtering apparatus according to claim 5, wherein the time during which the voltage is controlled to be zero volts is immediately after arcing.

8. The sputtering apparatus according to claim 5, wherein an amplitude of said positive voltage is approximately 10% of the amplitude of the negative voltage.

9. A film-deposition method for forming a thin film composed mainly of silicon oxide using a power processing portion including a first switching circuit connected in series between a negative pole of a sputtering power generating portion and a cathode composed mainly of silicon and being disposed in a vacuum chamber, and a second switching circuit connected in series between the cathode and a DC power source other than the sputtering power generating portion for supplying a positive potential to the cathode, the method comprising the steps of:

controlling a turning-on time and a turning-off time of the first switching circuit so that a negative voltage is intermittently applied in a constant periodic cycle to the cathode;

using at least one of an oxygen gas and an inert gas as a sputtering gas;

controlling the turning-on time and the turning-off time of the first switching circuit so that a time during which the negative voltage is not applied includes a time during which the voltage is zero volts in a range of from 10 $\mu$s to 10 ms, and the zero voltage time is a time required by one arcing from its generation to extinction or longer; and controlling a turning-on time of the second switching circuit during the time which the voltage is controlled to be zero volts to include a period of time during which a positive voltage is applied within a range of from 1 $\mu$s to 20 $\mu$s.

10. The film-deposition method according to claim 9, wherein the time during which the voltage is controlled to be zero volts is immediately after arcing.

11. The film-deposition method according to claim 9, wherein an amplitude of said positive voltage is approximately 10% of the amplitude of the negative voltage.

12. A film-deposition method for forming a thin film composed mainly of silicon nitride using a power processing portion including a first switching circuit connected in series between a negative pole of a sputtering power generating portion and a cathode composed mainly of silicon and being disposed in a vacuum chamber, and a second switching circuit connected in series between the cathode and a DC power source other than the sputtering power generating portion for supplying a positive potential to the cathode, the method comprising the steps of:

controlling a turning-on time and a turning-off time of the first switching circuit so that a negative voltage is intermittently applied in a constant periodic cycle to the cathode;

using at least one of a nitrogen gas and an inert gas as a sputtering gas;

controlling the turning-on time and the turning-off time of the first switching circuit so that a time during which the negative voltage is not applied includes a time during which the voltage is zero volts in a range of from 10 $\mu$s to 10 ms, and the zero voltage time is a time required by one arcing from its generation to extinction or longer, and controlling a turning-on time of the second switching circuit during the time which the voltage is controlled to be zero volts to include a period of time during which a positive voltage is applied within a range of from 1 $\mu$s to 20 $\mu$s.

13. The film-deposition method according to claim 12, wherein the composition ratio of the silicon nitride (atomic molar ratio of N/Si) is 1.25 to 1.36.

14. The film-deposition method according to claim 12, wherein the time during which the voltage is controlled to be zero volts is immediately after arcing.

15. The film-deposition method according to claim 12, wherein an amplitude of said positive voltage is approximately 10% of the amplitude of the negative voltage.

16. A film-deposition method for forming a transparent conductive thin film composed mainly of oxide by using a sputtering target disposed in a vacuum chamber and being configured to form the transparent conductive film, and by using a power processing portion including a first switching circuit connected in series between a negative pole of a sputtering power generating portion and the sputtering target, and a second switching circuit connected in series between the sputtering target and a DC power source other than the sputtering power generating portion for supplying a positive potential to the sputtering target, the method comprising the steps of:

controlling a turning-on time and a turning-off time of the first switching circuit so that a negative voltage is intermittently applied;

using at least one of an oxygen gas and an inert gas as a sputtering gas;

controlling the turning-on time and the turning-off time so that a time during which the negative voltage is not applied includes a time during which the voltage is zero volts in a range of from 10 $\mu$s to 10 ms, and the zero voltage time is a time required by one arcing from its generation to extinction or longer; and controlling a turning-on time of the second switching circuit during which the voltage is controlled to be zero volts to include a period of time during which a positive voltage is applied within a range of from 1 $\mu$s to 20 $\mu$s.

17. The film-deposition method according to claim 16, wherein the sputtering target is composed mainly of tin or tin oxide.

18. The film-deposition method according to claim 17, wherein the sputtering target contains metal antimony or an antimony compound.

19. The film-deposition method according to claim 16, wherein the sputtering target is composed mainly of indium or indium oxide.

20. The film-deposition method according to claim 19, wherein the sputtering target contains tin.

21. The film-deposition method according to claim 16, wherein the sputtering target is composed mainly of zinc or zinc oxide.

22. The film-deposition method according to claim 16, wherein the sputtering target contains a simple substance or a compound of at least one metal selected from the group consisting of aluminum, gallium, indium, boron and silicon.

23. The film-deposition method according to claim 16, wherein the time during which the voltage is controlled to be zero volts is immediately after arcing.

24. The film-deposition method according to claim 16, wherein an amplitude of said positive voltage is approximately 10% of the amplitude of the negative voltage.

* * * * *